(12) United States Patent
Sofer et al.

(10) Patent No.: US 9,917,581 B2
(45) Date of Patent: Mar. 13, 2018

(54) ELECTRONIC DEVICE AND METHOD FOR OPERATING A POWER SWITCH

(75) Inventors: Sergey Sofer, Rishon Lezion (IL); Eyal Melamed-Kohen, Modiin (IL); Michael Priel, Netanya (IL)

(73) Assignee: NXP USA, Inc., Austin, TX (US)

( * ) Notice: Subject to any disclaimer, the term of this patent is extended or adjusted under 35 U.S.C. 154(b) by 518 days.

(21) Appl. No.: 14/398,318

(22) PCT Filed: May 29, 2012

(86) PCT No.: PCT/IB2012/052682
§ 371 (c)(1),
(2), (4) Date: Oct. 31, 2014

(87) PCT Pub. No.: WO2013/179087
PCT Pub. Date: Dec. 5, 2013

(65) Prior Publication Data
US 2015/0084417 A1    Mar. 26, 2015

(51) Int. Cl.
*H03K 17/30* (2006.01)
*H03K 17/94* (2006.01)
(Continued)

(52) U.S. Cl.
CPC ....... *H03K 17/94* (2013.01); *H03K 17/04123* (2013.01); *H03K 17/302* (2013.01);
(Continued)

(58) Field of Classification Search
USPC .......................................................... 307/23
See application file for complete search history.

(56) References Cited

U.S. PATENT DOCUMENTS 5,019,770 A    5/1991    Harada et al.
5,534,675 A    7/1996    Kaneko et al.
(Continued)

OTHER PUBLICATIONS

International Search Report and Written Opinion correlating to PCT/IB2012/052682 dated Feb. 28, 2013.
(Continued)

*Primary Examiner* — Hal Kaplan
*Assistant Examiner* — Xuan Ly

(57) ABSTRACT

An electronic device comprising a first power switch connectable or connected between a first voltage source and a load is proposed. The first power switch assumes a conductive state in response to a power-on request and a non-conductive state in response to a power-off request, for energizing and deenergizing the load, so that a voltage across the first power switch tends to a positive high level when the first power switch is in the non-conductive state and to a positive low level when the first power switch is in the conductive state. The device further comprises a second power switch connectable or connected between a second voltage source and the load. The second power switch assumes a conductive state in response to the power-on request and a non-conductive state when the voltage across the first power switch is below a defined switch-off threshold lower than the high level. The second voltage source thus assists the first voltage source in powering up the load. A method of operating the electronic device is also described.

20 Claims, 5 Drawing Sheets

(51) Int. Cl.
*H03K 17/0412* (2006.01)
*H03K 17/693* (2006.01)

(52) U.S. Cl.
CPC ........ *H03K 17/693* (2013.01); *Y10T 307/344* (2015.04); *Y10T 307/549* (2015.04)

(56) References Cited

U.S. PATENT DOCUMENTS

| | | | |
|---|---|---|---|
| 5,701,597 A * | 12/1997 | Nakanishi | H02J 7/0024 455/127.1 |
| 5,736,842 A | 4/1998 | Jovanovic | |
| 5,917,250 A * | 6/1999 | Kakalec | H02J 1/10 307/113 |
| 6,061,253 A | 5/2000 | Igarashi et al. | |
| 6,084,383 A * | 7/2000 | Borinsky | G05F 1/465 307/87 |
| 6,118,261 A | 9/2000 | Erdelyi et al. | |
| 6,208,194 B1 | 3/2001 | Kennedy | |
| 6,538,497 B2 | 3/2003 | Thomas et al. | |
| 7,265,458 B2 | 9/2007 | Edelen et al. | |
| 7,336,003 B2 * | 2/2008 | Lathrop | H02J 3/14 307/64 |
| 8,089,259 B2 | 1/2012 | Sofer et al. | |
| 2002/0047742 A1 | 4/2002 | Setogawa | |
| 2002/0057076 A1 | 5/2002 | Hwang | |
| 2003/0062947 A1 | 4/2003 | Grasso et al. | |
| 2006/0033551 A1 | 2/2006 | Dong et al. | |
| 2007/0257705 A1 | 11/2007 | Blisson | |
| 2009/0009151 A1 | 1/2009 | Arnold | |
| 2009/0021079 A1 * | 1/2009 | Johnson, Jr. | H02J 9/062 307/68 |
| 2009/0032820 A1 * | 2/2009 | Chen | H01L 29/402 257/76 |
| 2011/0095601 A1 * | 4/2011 | Johansson | H02J 13/0003 307/9.1 |
| 2012/0176176 A1 * | 7/2012 | Swamy | H03K 17/04123 327/399 |
| 2012/0228962 A1 * | 9/2012 | Sharma | H02H 9/001 307/113 |

OTHER PUBLICATIONS

Non-Final Office Action dated Jan. 26, 2011 for U.S. Appl. No. 12/261,599, 12 pages.
Notice of Allowance dated Aug. 15, 2011 for U.S. Appl. No. 12/261,599, 10 pages.

* cited by examiner

ELECTRONIC DEVICE AND METHOD FOR OPERATING A POWER SWITCH

FIELD OF THE INVENTION

This invention relates to an electronic device and a method of operating an electronic device.

BACKGROUND OF THE INVENTION

Power Gating (PG) is a technique for reducing leakage power in, e.g., low power devices, for example, in battery-powered electronic devices. A power switch can be used to connect and disconnect an electric load to and from a power supply. The load can thus be energized and de-energized by controlling the power switch in an appropriate manner. The load may, for instance, comprise an electronic circuit. A plurality of loads, e.g. a plurality of electronic circuits on the same integrated circuit die, may be connected in parallel to a common power supply. Each load may have its own power switch so that the load in question can be energized and de-energized, i.e., powered on and off, individually. For instance, the load may thus be powered on and off while the other loads remain on power.

SUMMARY OF THE INVENTION

The present invention provides an electronic device and a method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

Figure 1:
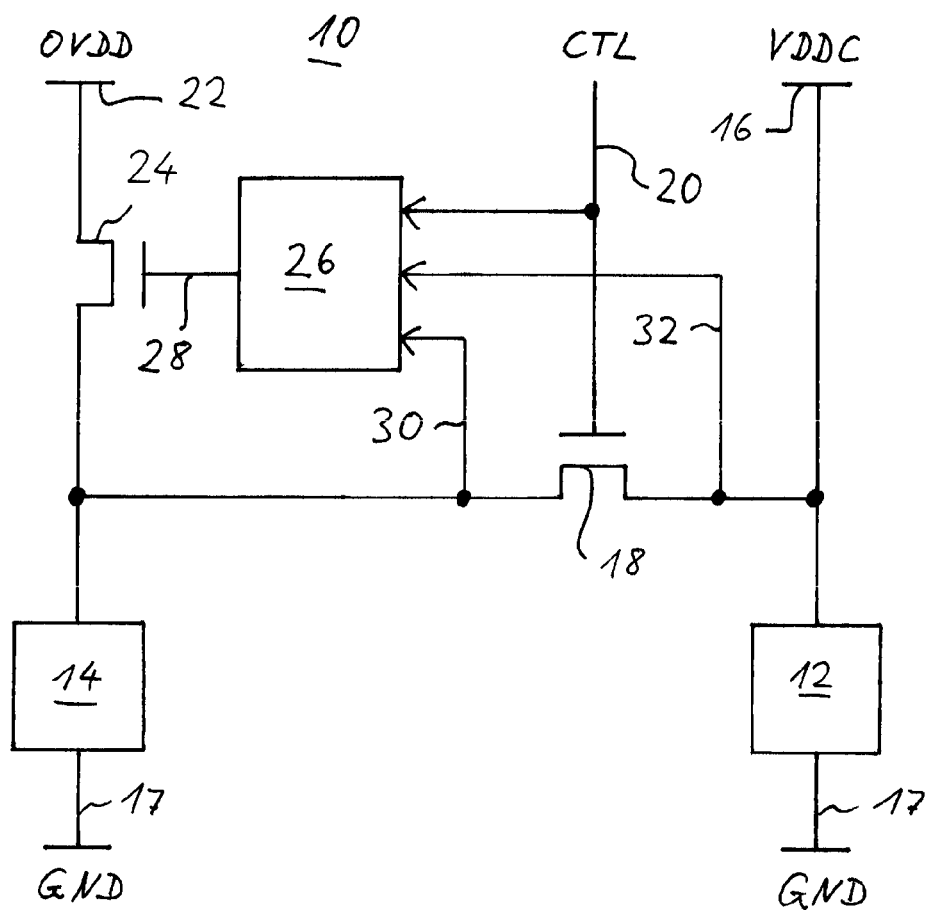
FIG. 1 schematically shows an example of an embodiment of an electronic device.

The example of an electronic device 10 shown in FIG. 1 comprises, for example, a first load 12 and a second load 14. Each of the loads may, for instance, comprise an integrated circuit. Alternatively, the loads 12 and 14 may be located within a single integrated circuit, e.g. on the same die. In the shown example, the loads 12 and 14 are each connected between a reference voltage source 17 and a first voltage source 16. The reference voltage source 17 may, for instance, be arranged to provide a ground potential. The first voltage source 16 and the reference voltage source 17 may, for instance, be provided by a pair of terminals of a power supply (not shown). The power supply may, for instance, include a battery or an alternating current (AC) to direct current (DC) voltage converter. Although only two loads are shown in the figure, more than two loads may be connected in parallel between the reference voltage source 17 and the first voltage source 16.

In the shown example, the first load 12 may be connected permanently between the reference voltage source 17 and the first voltage source 16. The first load 12 may, therefore, be constantly on power as long as there is a sufficient voltage between the reference voltage source 17 and the first voltage source 16. The first load 12 may, for instance, comprise one or more SRPG flip-flops or control signal buffers that should remain on power. Alternatively, the first load 12 may be gated so that it may be powered on and off in a controlled manner. To this end, a power switch (not shown) may be connected between the first load 12 and the first voltage source 16 so that the loads 12 and 14 can be powered on and off independently from one another. The power switch may alternatively be integrated in the first load 12.

For ease of explanation, it is assumed in the following description that there is a non-zero voltage difference between the reference voltage source 17 and the first voltage source 16. This voltage difference may be constant over the time intervals that are of interest for understanding the present description. Such a time interval may, for instance, have a duration of less than one second or even less than one millisecond. In practice, the voltage VDDC provided by the first voltage source 16 may vary relative to the reference voltage GND provided by the reference voltage source 17, such variation occurring on a time scale substantially longer than, e.g., one millisecond or one second. Such slow variation of the supply voltage (i.e., the voltage between voltage sources 16 and 17) may, for instance, be due to battery fading and may be disregarded herein.

In the shown example, a first power switch 18 is connected between the first voltage source 16 and the second load 14. The first power switch 18 can be controlled so as to energize and de-energize the second load 14 as desired. In other words, the first power switch 18 can be controlled to connect and disconnect the second load 14 to and from the first voltage source 16, thereby providing the second load 14 with power from the first voltage source 16 or interrupting the flow of energy, depending on whether the first power switch 18 is in a conductive state or in a non-conductive state. In the shown example, the first power switch 18 may be arranged to assume the conductive state in response to a power on request and a non-conductive state in response to a power off request. The first power switch 18 may, for instance, be controlled by means of a control signal CTL, for instance, a control voltage via, e.g., a control line 20. The power on request may, in this case, consist of, for example, a transition of the control voltage CTL from a first control voltage level to a different second control voltage level, while the power off request may consist of the reverse transition, i.e., a transition of the control voltage CTL from the second control voltage level to the first control voltage level.

In the shown example, the first power switch 18 may, for instance, be a transistor, e.g., a field effect transistor such a PMOS or NMOS field effect transistor. The first power switch 18 may alternatively be a mechanical switch. The mechanical switch may, for instance, be controlled via an electrical relay (not shown) that is responsive to the control voltage CTL. The mechanical switch may alternatively be a micro-electromechanical switch (MEMS) controlled by e.g. an electromagnetic field. The switch 18 or 24 or both may, e.g., be a dual gate oxide (DGO) transistor. Such transistors may have lower leakage currents in comparison to e.g. single gate oxide transistors which may be used, for instance, in integrated circuits operated at lower supply voltages.

A problem that may be observed in the circuit as described so far is that closing the first power switch 18, i.e., setting it into its conductive state, may affect the voltage across the first load 12. One reason is that the second load may draw a large electrical current from the first voltage source 16 or from the first load 12, or from both, until the voltage across the first power switch 18 has stabilized, which may be the case, for instance, when the voltage across the first power switch 18 has become small compared to the voltage across the second load 14. Closing the first power switch 18 may thus cause transient currents, noise, voltage spikes, or a combination thereof, which may be detrimental to an optimal functioning of the first load 12 and to any other loads connected to the first voltage source 16, if any.

The electronic device 10 shown in FIG. 1 may comprise additional elements which may be arranged so as to overcome, or at least reduce those adverse effects. Notably, a second power switch 24 may be provided for connecting the second load 14 to a second voltage source 22. The second voltage source may for instance be a voltage source provided for other purposes, such as energizing other components on the same integrated circuit. Moreover, the second voltage source 22 may be arranged to provide a different, e.g. higher, voltage than the first voltage source 16. The second voltage source 22 may thus assist the first voltage source 16 in powering up the second load 14 in response to a power on request. In other words, the second power switch 24 may be connectable or connected between the second voltage source 22 and the second load 14 and arranged to assume the conductive state in response to the power on request. The second power switch 24 may further be arranged to assume a nonconductive state when the voltage across the first power switch 18 is below a defined switch-off threshold V2 (see FIG. 3). The switch-off threshold V21 which corresponds to a point in time at which the second power switch 24 may be opened, i.e., set into its nonconductive state, may be intermediate between a positive low level V3 and a positive high level V0 of the voltage across the first power switch 18 (see FIG. 3). The positive high level V0 may be defined as an asymptotic value of the voltage across the first power switch 18 when the first power switch 18 has assumed its nonconductive state, i.e., a level at which the voltage across the first power switch 18 may settle after opening the first power switch 18. Similarly, the positive low level V3 may be defined as an asymptotic value of the voltage across the first power switch 18 when the first power switch 18 has assumed its conductive state, i.e., a level at which the voltage across the first power switch 18 may settle after closing the first power switch 18. Opening the second power switch 24 when the voltage across the first power switch 18 has dropped below the switch-off threshold V2 may ensure that the second voltage source 22 is involved only in a relatively short phase (assist phase) of powering up the second load 14 but not necessarily in a subsequent steady phase in which the voltage across the first power switch 18 has substantially settled at the low level V3.

Design constraints on the second power switch 24 can therefore be relaxed compared to an alternative design in which the second voltage source 22 remains connected to the second load 14 beyond the power up phase. For instance, the second voltage source 22 and the reference voltage source 17 may be provided by a pair of terminals of a capacitor. The capacitor may be arranged to be charged during a steady phase of operation and decharged via the second power switch 24 in response to a power on request. The capacitor may notably be arranged so as to be charged to a voltage level OVDD that is higher than the voltage level VDDC provided by the first voltage source 16. Alternatively, the second voltage source 22 may be provided, for example, by means of a separate power supply unit. The separate power supply unit may be provided in addition to a first power supply unit arranged to supply the first voltage source 16. The first power supply unit and the second power supply unit, or both, for example, may comprise one or more batteries.

Disconnecting the second voltage source 22 from the load 14 after the power up phase may also allow the second voltage source 22 to provide a higher voltage level than the first voltage source 16. The second voltage source 22 providing a higher voltage level than the first voltage source 16 may be beneficial for charging the load 14 as rapidly as possible.

The first power switch 18 may thus be connectable or connected between the first voltage source 16 and the load 14 and arranged to assume a conductive state in response to a power on request and a nonconductive state in response to a power off request for energizing and de-energizing the load 14, so that a voltage across the first power switch tends to a positive high level V0 when the first power switch 18 is in its nonconductive state and to a positive low level V3 when the first power switch 18 is in its conductive state. In contrast, the second power switch 24 may be connectable or connected between the second voltage source 22 and the load 14 and arranged to assume a conductive state in response to the power on request and a nonconductive state when the voltage across the first power switch 18 is below a defined switch off threshold V2 that is lower than the high level V0.

To ensure that the second power switch 24 assumes the nonconductive state when the voltage across the first power switch 18 is below the switch off threshold V2, the second power switch 24 may be arranged to assume its nonconductive state in response to the voltage across the first power switch 18 being below the switch off threshold V2. In other words, the second power switch 24 may be responsive to the voltage across the first power switch 18 such that the latter voltage being below the switch off threshold V2 triggers the second power switch 24 to assume its nonconductive state. Alternatively, the second power switch 24 may be controlled in a suitable manner, e.g., using a timer or delay element responsive to the turn on request, such that the second power switch 24 passes from its conductive state into its nonconductive state at a time when the voltage across the first power switch 18 falls below the switch off threshold V2.

Still referring to FIG. 1, the electronic device 10 may comprise a control unit 26 for controlling the second switch 24. The control unit 26 may, e.g., be a dedicated circuit. In the shown example, the control unit 26 may be arranged to receive as input signals, the power control signal CTL via, e.g., the control line 20. The power control signal may convey the turn-on and turn-off requests. The control unit 26 may be further connected to a low side and to a high side of the first power switch 18, e.g., via a first conductor 30 and a second conductor 32, respectively. The control unit 26 may thus be arranged to sense the voltage across the first power switch 18. The control unit 26 may further be arranged to output a control signal to the second power switch 24, e.g., via a signal line or conductor 28. The control signal to the second power switch 24 may, for instance, be a gate control voltage generated by the control unit 26. The control unit 26 may thus be arranged to set the power switch 24 into the conductive state in response to a power on request and into a nonconductive state in response to the sensed voltage across the first power switch 18 being lower than the defined switch off threshold V2.

Figure 2:
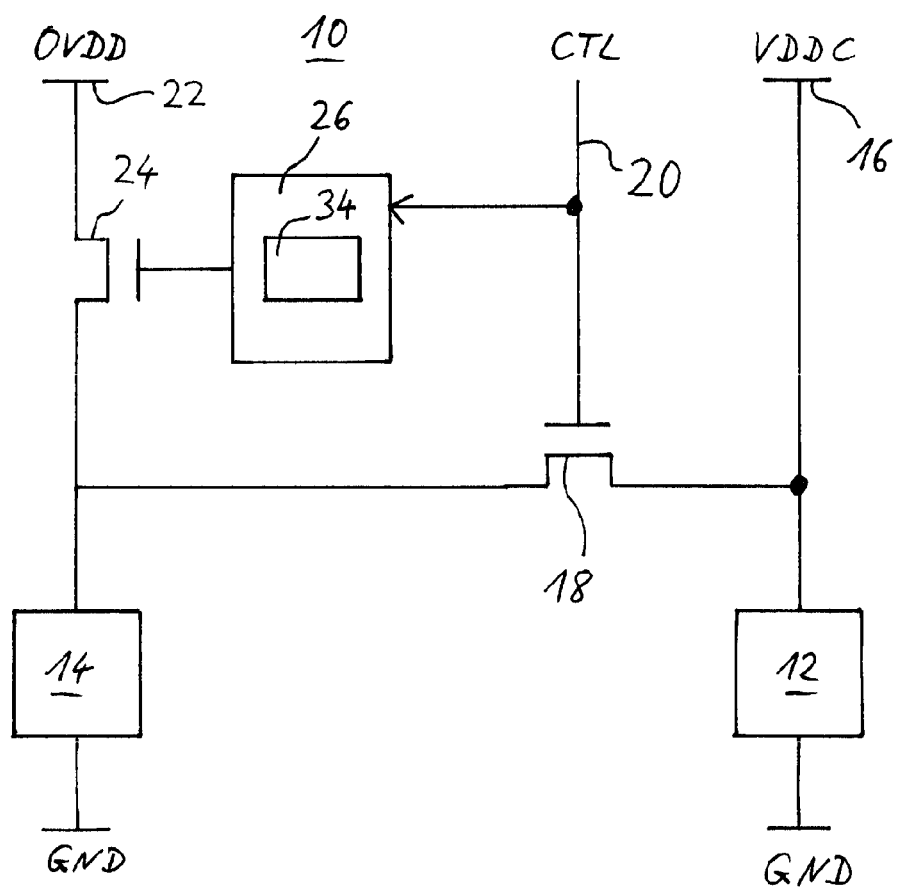
FIG. 2 schematically shows an example of another embodiment of the electronic device.

Referring now to FIG. 2, a variant of the electronic device 10 of FIG. 1 is shown. In this example, the control unit 26 comprises a timer unit 34. The timer unit 34 may be connected to the second switch 24 and arranged to output a time lapse signal upon lapse of a defined time after a power on request. The second power switch 24 may thus be triggered to assume its nonconductive state in response to the time lapse signal. The timer unit 34 may, for example, comprise a delay element or several delay elements connected in series for passing the power control signal CTL or a signal derived therefrom on to the second power switch 24. This design may help to ensure that the second power source 22 is disconnected from the load 14 upon lapse of the predefined time, irrespective of the actual voltage across the first power switch 18. For instance, even in an unlikely event in which the voltage across the first power switch 18 remains high, e.g., due to the first voltage source 16 providing a voltage level that is too high, e.g., above a specific operating level, the second voltage source 22 will be disconnected from the rest of the circuit, thereby reducing a risk of damage to the device. The defined time after which the time lapse signal may be issued may, for instance, be between one nanosecond and one microsecond.

Figure 3:
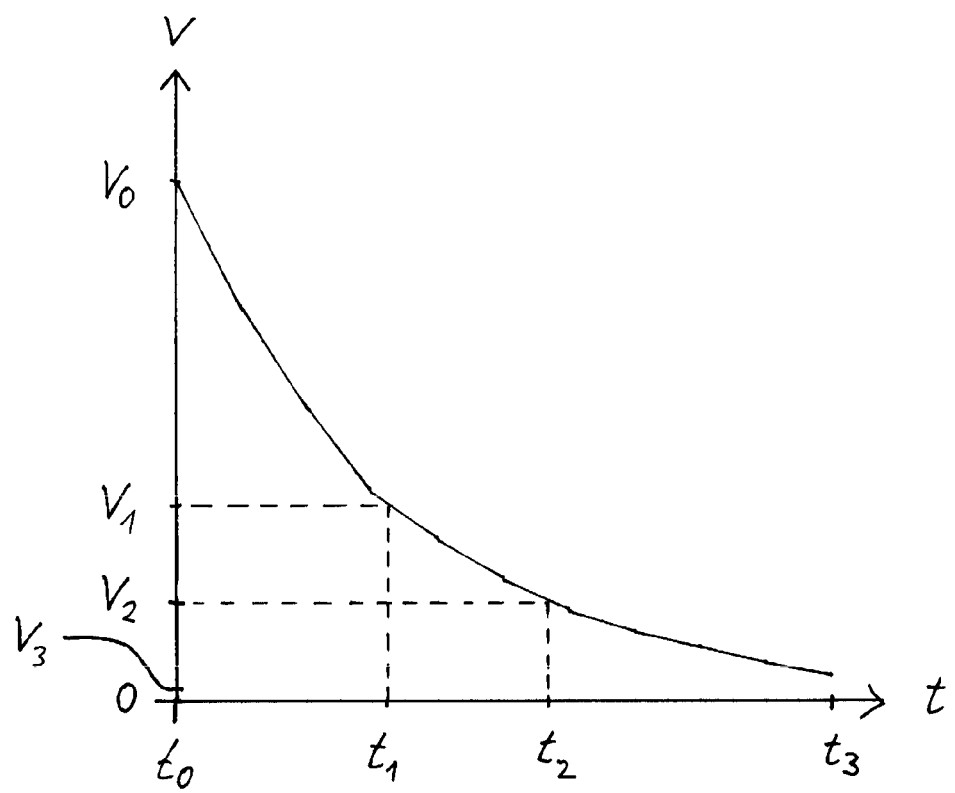
FIG. 3 schematically illustrates a time dependence of a voltage across a power switch when the power switch has passed from a nonconductive state to a conductive state.

The plot in FIG. 3 illustrates schematically the voltage V across the first power switch 18 as a function of time T. The value of the voltage V may be V0, V1, V2, and V3 at instants T0, T1, T2, and T3, respectively. The time T0 is assumed to coincide with the generation or detection of a power on request. At this time (T=T0), the first power switch 18 and the second power switch 24 may both be nonconductive. The voltage at the low side of the first power switch 18 may then be GND or close to GND level, while the voltage at the high side of the first power switch 18 may be VDDC, for example (see FIGS. 1 and 2). The voltage across the first power switch 18 may thus be at a positive high level V0. V0 may be, e.g., the difference VDDC GND. The second power switch 24 may become conductive in response to the power on request at time T=T0. As a result, the voltage V across the first power switch 18 may drop as a function of time T, e.g., exponentially. Depending on the design, the first power switch 18 may become conductive simultaneously with the second power switch 24, i.e., at T=T0, or at a later point in time. Arranging the second power switch 24 to become conductive along with the first power switch 18 in response to the power on request may help to speed up the charging process. On the other hand, arranging the second power switch 24 to become conductive only when the voltage V across the first power switch 18 has noticeably dropped, i.e., later than T0, may help to reduce noise or other undesired effects on the first load 12. For instance, the second power switch 18 may be arranged to become conductive when the voltage V is below a defined switch on threshold V1 lower than the high level V0. In other words, before time T0, both power switches 18 and 24 may be nonconductive. At time T0, the second power switch 24 may become conductive. At time T1, the first power switch 18 may become conductive as well. At time T2, the second power switch 24 may again become nonconductive. At time T3, the voltage V may have settled substantially at the low level V3. V3 may be non-zero due to a non-zero resistance or impedance of the first power switch 18.

The first power switch 18 may thus be arranged to assume its conductive state in response to the power on request only when the voltage V across the first power switch 18 is below the defined switch on threshold V1, wherein V1 is lower than the high level V0. The switch on threshold V1 for the first switch 18 may be the same as or higher than the switch off threshold V2 for the second switch 24. The second voltage source 22 may thus assist the first voltage source 16 between times T0 and T2 (see FIG. 3).

As the first power switch 18, a switch having a relatively low resistance or impedance may be used, to result in a voltage drop across it that is low during its conductive state so that the voltage at both its ends may then be substantially equal. In contrast, the second power switch 24 may have a relatively high resistance in order to charge the load 14 (i.e., raise the voltage at the low side of the first power switch 18) if there is a sufficient voltage difference between the second voltage source OVDD 22 and the first voltage source VDDC 16, so the second switch 24 may then conduct a charging current that is sufficiently high despite of the relatively high resistance of the second switch 24. The resistance of a power switch means the resistance of the power switch when the power switch is in its conductive state. In other words, the second power switch 24 when in its conductive state may have a higher resistance than the first power switch 18 when in its conductive state.

The second power switch 24 may be further arranged to assume its nonconductive state in response to a power off request. It may thus be ensured that the second power switch 24 returns to its nonconductive state even before the voltage across the first power switch 18 has fallen below the switch off threshold V2 should a power off request be received immediately after a power on request.

Figure 4:
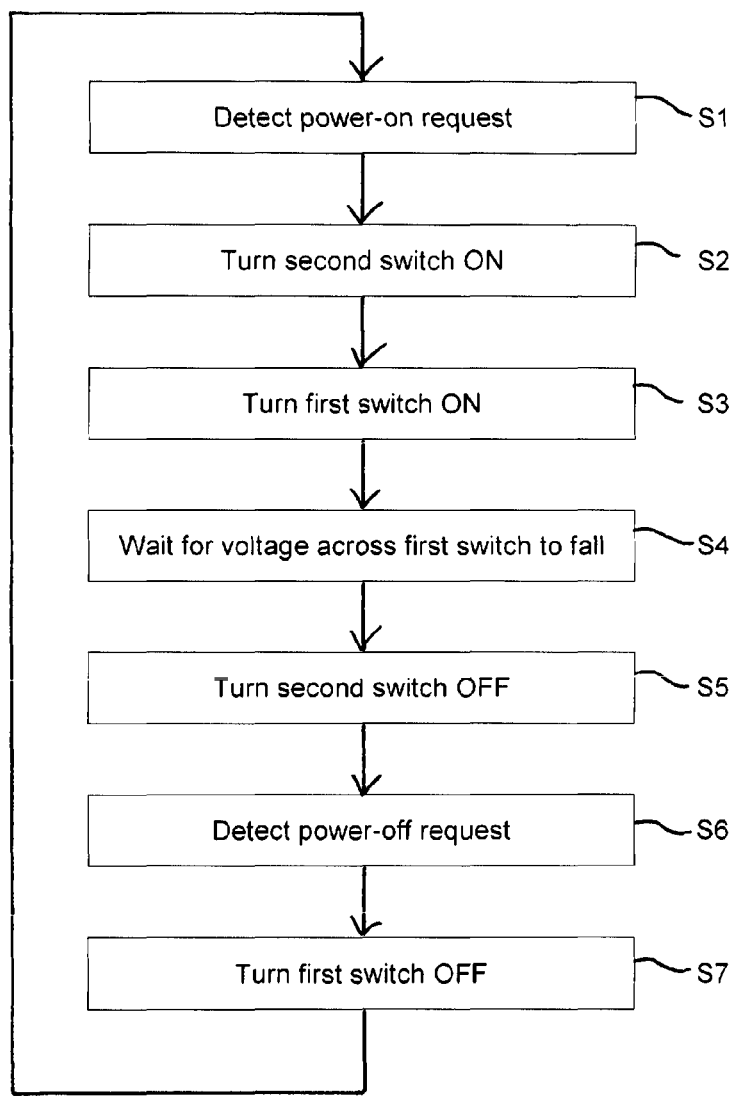
FIG. 4 shows a flow chart of an example of an embodiment of a method of operating the electronic device.
Figure 5:
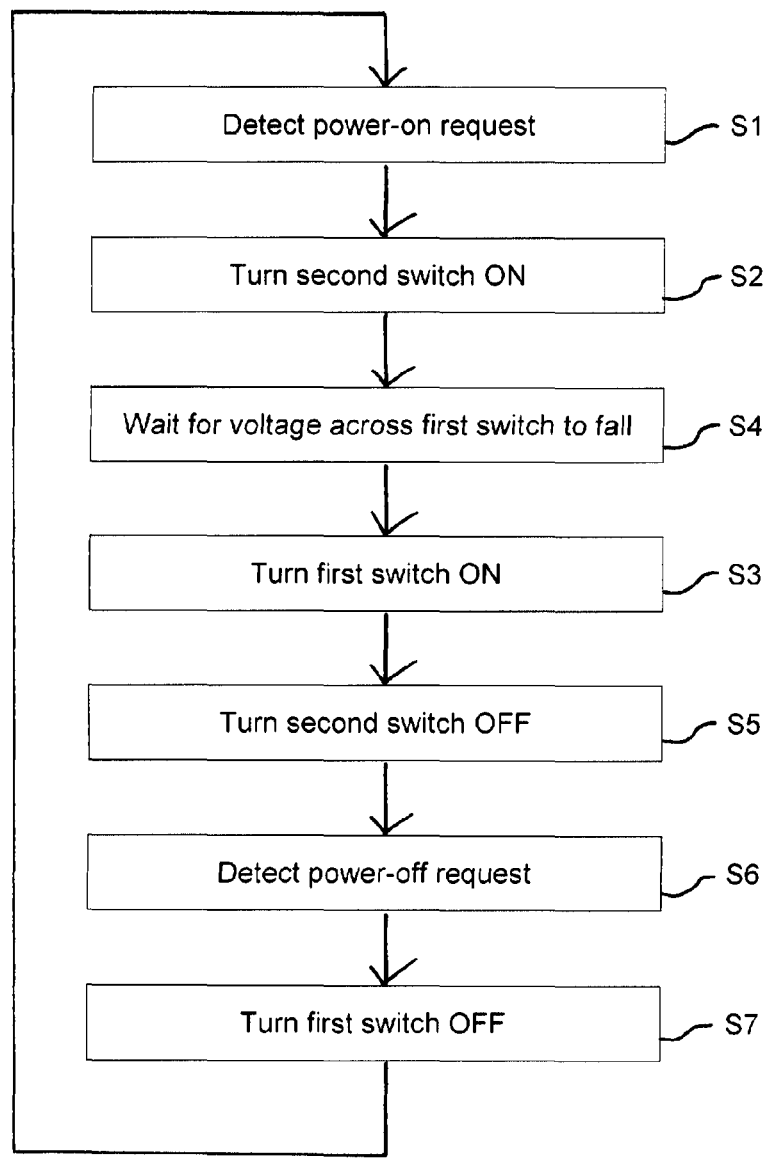
FIG. 5 shows a flow chart of an example of another embodiment of a method of operating the electronic device.

Operation of the electronic device 10 is further explained by making additional reference to FIGS. 4 and 5. Starting from a scenario in which both the first and second power switches 18 and 24 are nonconductive (off), a power on request may be detected (block S1). The term "detecting" is to be understood in a broad sense. Any physical effect of a power on request may be used to detect that power on request. Analogously, any physical effect of a power off request may be used to detect that power off request.

The second power switch 24 may be turned on in response to the power on request (block S2). As a result, the voltage V across the first power switch 18 may start to fall from its initial high level V0. The first power switch 18 may be turned on simultaneously with the second power switch 24 (block S3). Turning the first power switch 18 on along with the second power switch 24 may reduce the duration of charging the load 14. When the voltage V across the first power switch 18 has fallen to the switch off level V2 (see FIG. 3), the second power switch 24 may be turned off (blocks S4 and S5). The load 14 may then continue to be powered via only the first power switch 18.

A power off request may be detected at some later point in time (block S6). In response to detecting the power off request, the first power switch 18 may be turned off (block S7). The process flow may then return to block S1.

FIG. 5 illustrates a variant in which the first power switch 18 is turned on only when the voltage V across the first power switch 18 has fallen to a switch on level V1 which is lower than the high level V0. The flow chart of FIG. 5 differs from the one in FIG. 4 only in that the blocks S3 and S4 have been interchanged. In a related variant, the first power switch 18 is turned on when the second power switch 24 is turned off. In this case, T1=T2 and V1=V2.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed. In other words, the terms "high" and "low", "positive" and "negative" are equivalent to "low" and "high", "negative and positive", provided that these and related terms are interchanged in a consistent manner throughout the specification, including the claims, as is clear to the skilled person.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

For example, the power switch 18 may be controlled via the control unit 26 rather than directly by the control signal CTL.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the device 10 may include one or more loads, e.g., loads 12 and 14, and at least one power supply unit. Alternatively, the examples may be implemented as any number of separate integrated circuits or separate devices interconnected with each other in a suitable manner. For example, these loads or the one or more power supply units are not necessarily part of the device 10 but may be connectable to it in a suitable manner, e.g. via dedicated terminals of the device 10.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An electronic device, comprising:
a first power switch connectable or connected between a first voltage source and a load, and arranged to assume a conductive state in response to a power-on request and a non-conductive state in response to a power-off request, for energizing and deenergizing said load, so that a voltage across said first power switch tends to a positive high level voltage when said first power switch is in said non-conductive state and to a positive low level when said first power switch is in said conductive state; and a second power switch connectable or connected between a second voltage source and said load, and arranged to assume a conductive state in response to said power-on request and a non-conductive state when said voltage across said first power switch is below a defined switch-off threshold voltage, wherein the defined switch-off threshold voltage is intermediate between said high level voltage across the first power switch and a low level voltage across the first power switch.

2. The device of claim 1, wherein said second power switch is arranged to assume its non-conductive state in response to said voltage across said first power switch being below said switch-off threshold voltage.

3. The device of claim 1, comprising a delay unit connected to said second switch and arranged to output a time-lapse signal upon lapse of a defined time after said power-on request, said second power switch being arranged to assume its non-conductive state in response to said time-lapse signal.

4. The device of claim 3, wherein said defined time is between one nanosecond and one microsecond.

5. The device of claim 1, wherein said second power switch is further arranged to assume its non-conductive state in response to said power-off request.

6. The device of claim 1, wherein said first power switch is arranged to assume its conductive state in response to said power-on request only when said voltage across said first power switch is below a defined switch-on threshold voltage lower than said high level voltage.

7. The device of claim 6, wherein said switch-on threshold voltage is the same as or higher than said switch-off threshold voltage.

8. The device of claim 1, wherein at least one of said first power switch and said second power switch comprises a dual gate oxide transistor.

9. The device of claim 1, wherein said second power switch when in its conductive state has a higher resistance or impedance than said first power switch when in its conductive state.

10. The device of claim 1, comprising a first power supply unit for providing said first voltage source and a separate second power supply unit for providing said second voltage source.

11. The device of claim 1, wherein said first voltage source is arranged to provide a first voltage level and said second voltage source is arranged to provide a second voltage level higher than said first voltage level.

12. The device of claim 1, wherein said load is a second load and a first load is connectable or connected to said first voltage source in parallel to a group comprising said first power switch and said second load.

13. A method of operating an electronic device, the device comprising a first power switch connected between a first voltage source and a load, and a second power switch connected between a second voltage source and said load, the method comprising:
setting said second power switch into a conductive state in response to a power-on request, thereby causing a voltage across said load to rise and a voltage across said first power switch to fall;
setting said first power switch into a conductive state in response to said power-on request, for energizing said load; and
setting said second power switch into a non-conductive state when said voltage across said first power switch has fallen below a defined switch-off threshold voltage, wherein the defined switch-off threshold voltage is intermediate between a high level voltage across the first power switch and a low level voltage across the first power switch.

14. The method of claim 13, further comprising:
setting said first power switch into a non-conductive state in response to a power-off request.

15. The method of claim 13, wherein the second power switch is arranged to assume its non-conductive state in response to the voltage across the first power switch being below the switch-off threshold voltage.

16. The method of claim 13, further comprising:
outputting, by a delay unit, a time-lapse signal upon lapse of a defined time after the power-on request;
setting the second power switch into the non-conductive state in response to the time-lapse signal.

17. The method of claim 16, wherein the defined time is between one nanosecond and one microsecond.

18. The method of claim 13, further comprising:
setting the second power switch into the non-conductive state in response to a power-off request.

19. The method of claim 13, further comprising:
setting the first power switch into the conductive state in response to the power-on request only when the voltage across the first power switch is below a defined switch-on threshold lower than the high level.

20. The device of claim 1, wherein the voltage across the first power switch is the high level voltage when the first power switch has assumed the non-conductive state, and the voltage across the first power switch is the low level voltage when the first power switch has assumed the conductive state.

* * * * *